United States Patent
Lin et al.

(10) Patent No.: US 11,853,613 B2
(45) Date of Patent: Dec. 26, 2023

(54) ENCODING CONTROL METHOD, MEMORY STORAGE DEVICE AND MEMORY CONTROL CIRCUIT UNIT

(71) Applicant: PHISON ELECTRONICS CORP., Miaoli (TW)

(72) Inventors: Yu-Hsiang Lin, Yunlin County (TW); Bo Lun Huang, Tainan (TW)

(73) Assignee: PHISON ELECTRONICS CORP., Miaoli (TW)

(*) Notice: Subject to any disclaimer, the term of this patent is extended or adjusted under 35 U.S.C. 154(b) by 66 days.

(21) Appl. No.: 17/724,504

(22) Filed: Apr. 20, 2022

(65) Prior Publication Data

US 2023/0289102 A1   Sep. 14, 2023

(30) Foreign Application Priority Data

Mar. 9, 2022   (TW) .................. 111108500

(51) Int. Cl.
*G06F 3/06*   (2006.01)

(52) U.S. Cl.
CPC .......... *G06F 3/0659* (2013.01); *G06F 3/0604* (2013.01); *G06F 3/0679* (2013.01)

(58) Field of Classification Search
CPC ............ G06F 11/004; G06F 11/1008; G06F 11/1068; G06F 11/1048; G06F 11/1004; G06F 11/1012; G06F 11/08; G06F 11/108; G06F 3/0614; G06F 3/064; G06F 3/0619; G06F 3/0688; G06F 3/0673; G06F 3/0644; G06F 3/0659; G06F 3/0679; G06F 3/0604

See application file for complete search history.

(56) References Cited

U.S. PATENT DOCUMENTS

| | | | |
|---|---|---|---|
| 2017/0255512 A1* | 9/2017 | Zamir | H03M 13/618 |
| 2018/0246783 A1* | 8/2018 | Avraham | G06F 16/9024 |
| 2018/0287632 A1* | 10/2018 | Rom | G06F 3/0688 |

FOREIGN PATENT DOCUMENTS

CN   112799874   5/2021

OTHER PUBLICATIONS

"Office Action of Taiwan Counterpart Application", dated Dec. 7, 2022, p. 1-p. 7.

* cited by examiner

*Primary Examiner* — Khoa D Doan
(74) *Attorney, Agent, or Firm* — JCIPRNET

(57) ABSTRACT

An encoding control method, a memory storage device and a memory control circuit unit are disclosed. The method includes: performing, by an encoding circuit, a first encoding operation to generate first parity data according to write data, a first sub-matrix and a second sub-matrix of a parity check matrix; performing, by the encoding circuit, a second encoding operation to generate second parity data according to the write data, the first parity data, a third sub-matrix, a fourth sub-matrix and a fifth sub-matrix of the parity check matrix; and sending a first write command sequence to instruct a storing of the write data, the first parity data and the second parity data to a rewritable non-volatile memory module.

24 Claims, 8 Drawing Sheets

$$M = \begin{bmatrix} \begin{bmatrix} A \\ C \end{bmatrix} \begin{bmatrix} B \\ D \end{bmatrix} \begin{bmatrix} x \\ E \end{bmatrix} \end{bmatrix}$$

ENCODING CONTROL METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 111108500, filed on Mar. 9, 2022. The entirety of the above-mentioned patent application is hereby incorporated by reference herein and made a part of this specification.

BACKGROUND

1. Technology Field

The disclosure relates to an encoding control technology, and more particularly, to an encoding control method, a memory storage device, and a memory control circuit unit.

2. Description of Related Art

In general, to maintain data reliability, data is encoded to generate a corresponding error correcting code before it is stored in a rewritable non-volatile memory module. The error correcting code is then stored in the rewritable non-volatile memory module along with the corresponding data. Later, when the data is read out from the rewritable non-volatile memory module, the corresponding error correcting code may be used to correct possible errors in the data. However, the data length of the error correcting code generated by a single encoding circuit is not dynamically adjustable and is inflexible in use. If error correcting codes with different data lengths need to be generated, a plurality of encoding circuits need to be configured, which is not cost-effective.

SUMMARY

The disclosure provides an encoding control method, a memory storage device, and a memory control circuit unit capable of generating parity data with different data lengths by a single encoding circuit.

Exemplary embodiments of the disclosure provide an encoding control method for a rewritable non-volatile memory module. The encoding control method includes: write data is received from a host system; a first encoding operation is performed, by an encoding circuit, to generate first parity data according to the write data, a first sub-matrix of a parity check matrix, and a second sub-matrix of the parity check matrix; a second encoding operation is performed, by the encoding circuit, to generate second parity data according to the write data, the first parity data, a third sub-matrix of the parity check matrix, a fourth sub-matrix of the parity check matrix, and a fifth sub-matrix of the parity check matrix; and sending a first write command sequence to instruct a storing of the write data, the first parity data, and the second parity data to a rewritable non-volatile memory module.

Exemplary embodiments of the disclosure further provide a memory storage device, which includes a connection interface unit, a rewritable non-volatile memory module, and a memory control circuit unit. The connection interface unit is configured for coupling to a host system. The memory control circuit unit is coupled to the connection interface unit and the rewritable non-volatile memory module. The memory control circuit unit is configured to: receive write data from the host system; send a first write command sequence to instruct a storing of the write data, first parity data, and second parity data to the rewritable non-volatile memory module. The memory control circuit unit includes an encoding circuit, and the encoding circuit is configured to: perform a first encoding operation to generate the first parity data according to the write data, a first sub-matrix of a parity check matrix, and a second sub-matrix of the parity check matrix; and perform a second encoding operation to generate the second parity data according to the write data, the first parity data, a third sub-matrix of the parity check matrix, a fourth sub-matrix of the parity check matrix, and a fifth sub-matrix of the parity check matrix.

Exemplary embodiments of the disclosure further provide a memory control circuit unit for controlling a rewritable non-volatile memory module. The memory control circuit unit includes a host interface, a memory interface, an encoding circuit, and a memory management circuit. The host interface is configured for coupling to the host system. The memory interface is configured for coupling to the rewritable non-volatile memory module. The memory management circuit is coupled to the host interface, the memory interface, and the encoding circuit. The memory management circuit is configured to: receive write data from the host system; send a first write command sequence to instruct a storing of the write data, first parity data, and second parity data to the rewritable non-volatile memory module. The encoding circuit is configured to: perform a first encoding operation to generate the first parity data according to the write data, a first sub-matrix of a parity check matrix, and a second sub-matrix of the parity check matrix; and perform a second encoding operation to generate the second parity data according to the write data, the first parity data, a third sub-matrix of the parity check matrix, a fourth sub-matrix of the parity check matrix, and a fifth sub-matrix of the parity check matrix.

In summary, after receiving the write data, the encoding circuit may dynamically generate the first parity data and the second parity data according to different sub-matrices of the same parity check matrix. Subsequently, according to different operating conditions, the first parity data may be used alone or in conjunction with the second parity data to decode the write data. Thereby, the use flexibility of the memory storage device in performing data access can be improved.

It should be understood, however, that this Summary may not contain all of the aspects and embodiments of the disclosure, is not meant to be limiting or restrictive in any manner, and that the disclosure as disclosed herein is and will be understood by persons having ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
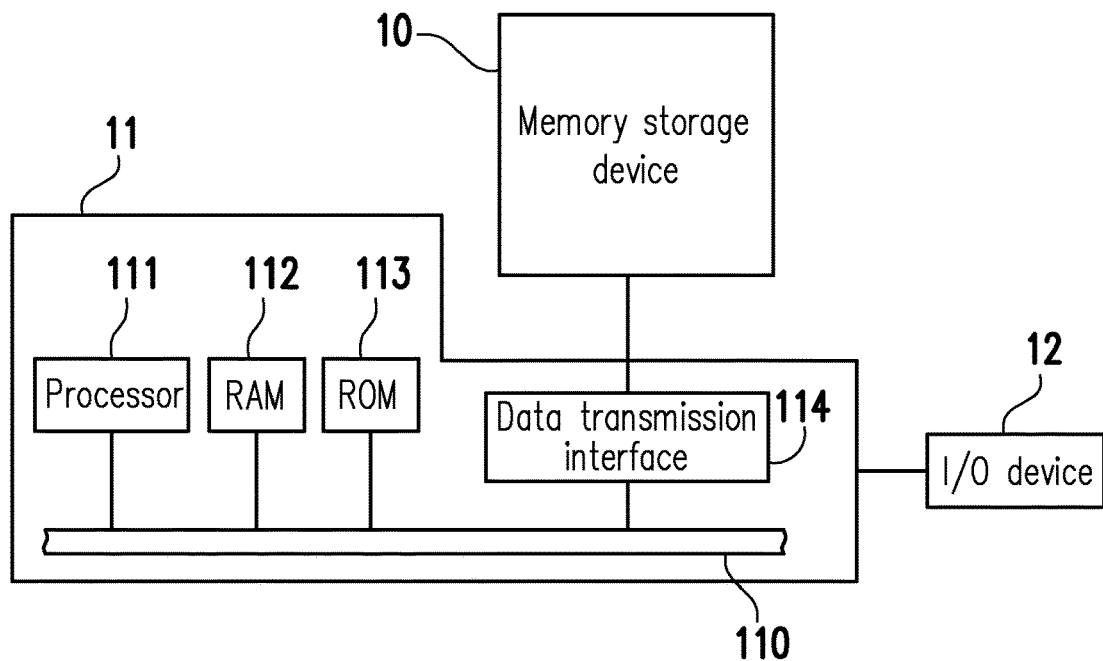
FIG. 1 is a schematic diagram of a host system, a memory storage device, and an input/output (I/O) device according to an exemplary embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

Embodiments of the disclosure may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

Note that the term "a" or "an" entity refers to one or more of that entity. As such, the terms "a" (or "an"), "one or more," and "at least one" can be used interchangeably herein.

In general, a memory storage device (also referred to as a memory storage system) includes a rewritable non-volatile memory module and a controller (also referred to as a control circuit). The memory storage device may be used in conjunction with a host system such that the host system may write data into the memory storage device or read data from the memory storage device.

Figure 2:
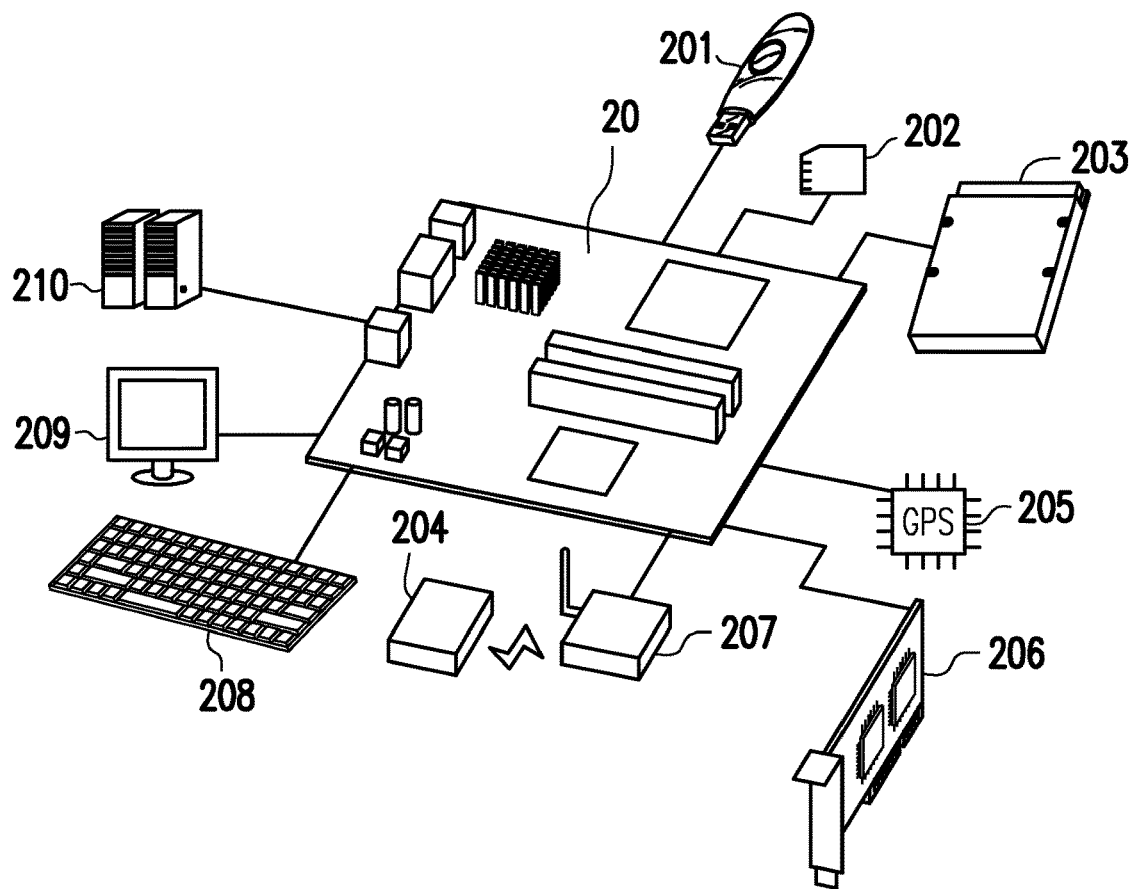
FIG. 2 is a schematic diagram of a host system, a memory storage device, and an I/O device according to an exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to an exemplary embodiment of the disclosure.

Referring to FIG. 1 and FIG. 2, a host system 11 may include a processor 111, a random access memory (RAM) 112, a read only memory (ROM) 113, and a data transmission interface 114. The processor 111, the random access memory 112, the ROM 113, and the data transmission interface 114 may be coupled to a system bus 110.

In an exemplary embodiment, the host system 11 may be coupled to a memory storage device 10 through the data transmission interface 114. For example, the host system 11 may store data to the memory storage device 10 or read data from the memory storage device 10 through the data transmission interface 114. Moreover, the host system 11 may be coupled to an I/O device 12 through the system bus 110. For example, the host system 11 may transmit output signals to the I/O device 12 or receive input signals from the I/O device 12 through the system bus 110.

In an exemplary embodiment, the processor 111, the random access memory 112, the ROM 113, and the data transmission interface 114 may be configured on a motherboard 20 of the host system 11. The number of the data transmission interfaces 114 may be one or more. Through the data transmission interface 114, the motherboard 20 may be coupled to the memory storage device 10 through wired or wireless means.

In an exemplary embodiment, the memory storage device 10 may be, for example, a flash drive 201, a memory card 202, a solid state drive (SSD) 203, or a wireless memory storage device 204. The wireless memory storage device 204 may be, for example, a memory storage device based on various wireless communication technologies, such as a near field communication (NFC) memory storage device, a WiFi memory storage device, a bluetooth memory storage device, or a bluetooth low energy memory storage device (e.g. iBeacon). In addition, the motherboard 20 may also be coupled to various I/O devices such as a global positioning system (GPS) module 205, a network interface card 206, a wireless transmission device 207, a keyboard 208, a screen 209, a speaker 210, and the like through the system bus 110. For example, in an exemplary embodiment, the motherboard 20 may access the wireless memory storage device 204 through the wireless transmission device 207.

In an exemplary embodiment, the host system 11 is a computer system. In an exemplary embodiment, the host system 11 may be any system that may physically work with a memory storage device to store data. In an exemplary embodiment, the memory storage device 10 and the host system 11 may include a memory storage device 30 and a host system 31 of FIG. 3, respectively.

Figure 3:
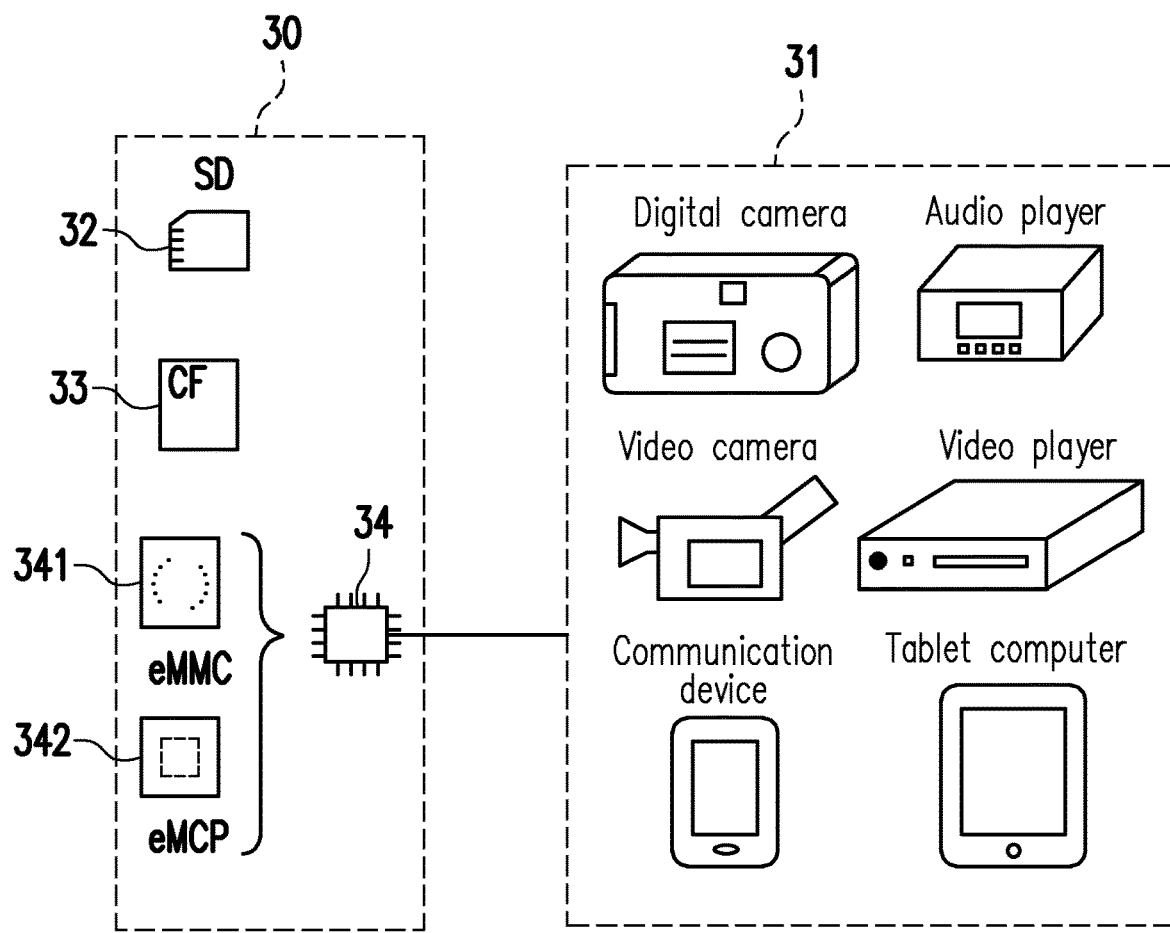
FIG. 3 is a schematic diagram of a host system and a memory storage device according to an exemplary embodiment of the disclosure.

FIG. 3 is a schematic diagram of a host system and a memory storage device according to an exemplary embodiment of the disclosure. Referring to FIG. 3, the memory storage device 30 may be used in conjunction with the host system 31 to store data. For example, the host system 31 may be a system such as a digital camera, a video camera, a communication device, an audio player, a video player, or a tablet computer. For example, the memory storage device 30 may be various non-volatile memory storage devices such as a secure digital (SD) card 32, a compact flash (CF) card 33, or an embedded storage device 34 used by the host system 31. The embedded storage device 34 includes various types of embedded storage devices such as an embedded multimedia card (eMMC) 341 and/or an embedded multi-chip package (eMCP) storage device 342, which directly couples the memory modules to the substrate of the host system.

Figure 4:
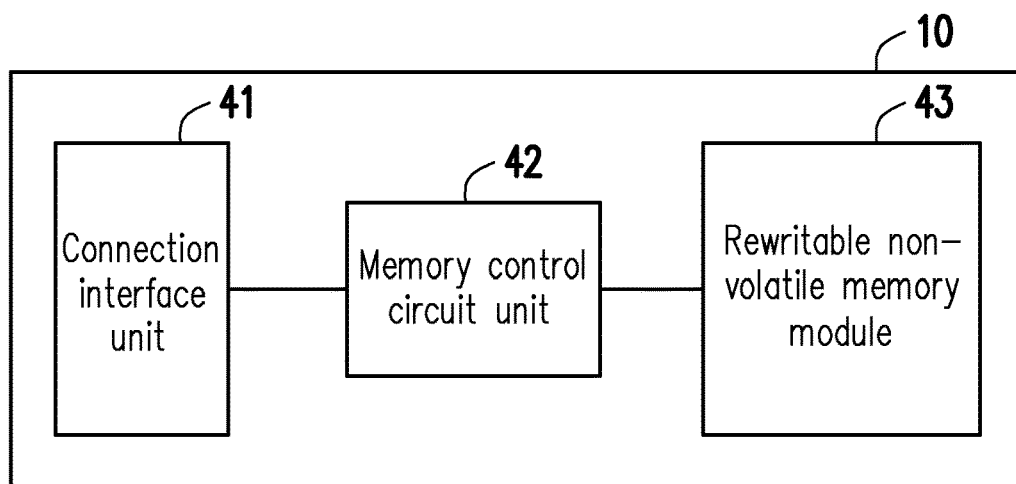
FIG. 4 is a schematic diagram of a memory storage device according to an exemplary embodiment of the disclosure.

FIG. 4 is a schematic diagram of a memory storage device according to an exemplary embodiment of the disclosure. Referring to FIG. 4, the memory storage device 10 includes a connection interface unit 41, a memory control circuit unit 42, and a rewritable non-volatile memory module 43.

The connection interface unit 41 is configured to couple the memory storage device 10 to the host system 11. The memory storage device 10 may communicate with the host system 11 through the connection interface unit 41. In an exemplary embodiment, the connection interface unit 41 is compatible with the peripheral component interconnect express (PCI Express) standard. In an exemplary embodiment, the connection interface unit 41 may also conform to the serial advanced technology attachment (SATA) standard, the parallel advanced technology attachment (PATA) standard, the Institute of Electrical and Electronics Engineers (IEEE) 1394 standard, universal serial bus (USB) standard, SD interface standard, the ultra-high speed-I (UHS-I) interface standard, the ultra-high speed II (UHS-II) interface standard, the memory stick (MS) interface standard, the MCP interface standard, the MMC interface standard, the eMMC interface standard, the universal flash Storage (UFS) interface standard, the eMCP Interface standard, the CF interface standard, the integrated device electronics (IDE) standard, or other suitable standard. The connection interface unit 41 and the memory control circuit unit 42 may be packaged in one chip, or the connection interface unit 41 may be arranged outside a chip including the memory control circuit unit 42.

The memory control circuit unit 42 is coupled to the connection interface unit 41 and the rewritable non-volatile memory module 43. The memory control circuit unit 42 is configured to execute a plurality of logic gates or control commands implemented in the form of hardware or firmware and perform operations such as data writing, reading, and erasing in the rewritable non-volatile memory module 43 according to the a command of the host system 11.

The rewritable non-volatile memory module 43 is configured to store the data written by the host system 11. The rewritable non-volatile memory module 43 may include a single-level cell (SLC) NAND-type flash memory module (i.e. a flash memory module that may store one bit in one memory cell), a multi-level cell (MLC) NAND-type flash memory module (i.e. a flash memory module that may store two bits in one memory cell), a triple-level cell (TLC) NAND-type flash memory module (i.e. a flash memory module that may store three bits in one memory cell), a quad-level cell (QLC) NAND-type flash memory module (i.e. a flash memory module that may store four bits in one memory cell), other flash memory modules, or other memory modules having the same characteristics.

Each memory cell in the rewritable non-volatile memory module 43 stores one or more bits by changing a voltage (also referred to as a threshold voltage hereinafter). To be specific, a charge trapping layer is present between a control gate and a channel of each memory cell. By applying a write voltage to the control gate, the amount of electrons in the charge trapping layer may be changed, and thus the threshold voltage of the memory cell may be changed. This operation of changing the threshold voltage of the memory cell is also referred to as "writing data into the memory cell" or "programming the memory cell". As the threshold voltage changes, each memory cell in the rewritable non-volatile memory module 43 has a plurality of storage states. By applying a read voltage, it is possible to determine which storage state a memory cell belongs to, and thereby obtains one or more bits stored in the memory cell.

In an exemplary embodiment, the memory cells of the rewritable non-volatile memory module 43 may constitute a plurality of physical programming units, and these physical programming units may constitute a plurality of physical erasing units. To be specific, memory cells on the same word line may constitute one or more physical programming units. If each memory cell may store more than 2 bits, the physical programming unit on the same word line may be classified into at least a lower physical programming unit and an upper physical programming unit. For example, a least significant bit (LSB) of a memory cell belongs to the lower physical programming unit, and a most significant bit (MSB) of a memory cell belongs to the upper physical programming unit. In general, in MLC NAND flash memory, the writing speed of the lower physical programming unit is higher than the writing speed of the upper physical programming unit, and/or the reliability of the lower physical programming unit is higher than the reliability of the upper physical programming unit.

In an exemplary embodiment, the physical programming unit is a minimum unit for programming. That is, the physical programming unit is the minimum unit for writing data. For example, the physical programming unit may be a physical page or a physical sector. If the physical programming unit is the physical page, the physical programming units may include a data bit area and a redundancy bits area. The data bit area has multiple of physical sectors for storing user data, and the redundant bits area is configured to store system data (e.g. management data such as an error correcting code). In an exemplary embodiment, the data bit area contains 32 physical sectors, and the size of each physical sector is 512 bytes (B). However, in other exemplary embodiments, the data bit area may also include 8, 16, or more or less physical sectors, and the size of each physical sector may also be larger or smaller. On the other hand, the physical erasing unit is the minimum unit for erasing. Namely, each physical erase unit contains the least number of memory cells to be erased together. For example, the physical erasing unit is a physical block.

Figure 5:
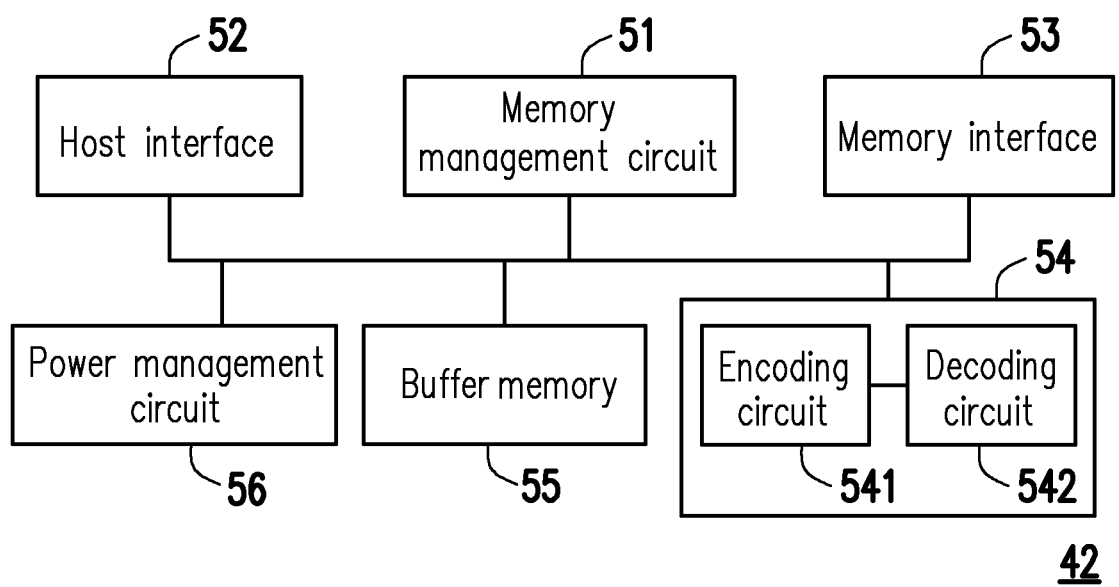
FIG. 5 is a schematic diagram of a memory control circuit unit according to an exemplary embodiment of the disclosure.

FIG. 5 is a schematic diagram of a memory control circuit unit according to an exemplary embodiment of the disclosure. Referring to FIG. 5, the memory control circuit unit 42 includes a memory management circuit 51, a host interface 52, a memory interface 53, and an error detecting and correcting circuit 54.

The memory management circuit 51 is configured to control the overall operation of the memory control circuit unit 42. To be specific, the memory management circuit 51 has a plurality of control commands, and when the memory storage device 10 operates, these control commands are executed to perform operations such as data writing, reading, and erasing. The following description of the operation of the memory management circuit 51 is equivalent to the description of the operation of the memory control circuit unit 42.

In an exemplary embodiment, the control commands of the memory management circuit 51 are implemented in the form of firmware. For example, the memory management circuit 51 has a microprocessor unit (not shown) and a ROM (not shown), and these control commands are programmed into the ROM. When the memory storage device 10 operates, the control commands are executed by the microprocessor unit to perform operations such as data writing, reading and erasing.

In an exemplary embodiment, the control commands of the memory management circuit 51 may also be stored in a specific area (e.g. a system area dedicated to storing system data in the memory module) of the rewritable non-volatile memory module 43 in the form of code. Further, the memory management circuit 51 has a microprocessor unit (not shown), a read-only memory (not shown), and a random access memory (not shown). In particular, the ROM has a boot code, and when the memory control circuit unit 42 is enabled, the microprocessor unit will first execute the boot code to load the control command stored in the rewritable non-volatile memory module 43 into the random access memory of the memory management circuit 51. Subsequently, the microprocessor unit will run these control commands to perform operations such as data writing, reading and erasing.

In an exemplary embodiment, the control commands of the memory management circuit 51 may also be implemented in the form of a hardware. For example, the memory management circuit 51 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit and the data processing circuit are coupled to the microcontroller. The memory cell management circuit is configured to manage the memory cells or memory cell groups of the rewritable non-volatile memory module 43. The memory writing circuit is configured to give a write command sequence to the rewritable non-volatile memory module 43 to write data into the rewritable non-volatile memory module 43. The memory reading circuit is configured to give a read command sequence to the rewritable non-volatile memory module 43 to read data from the rewritable non-volatile memory module 43. The memory erasing circuit is configured to give an erase command sequence to the rewritable non-volatile memory module 43 to erase data from the rewritable non-volatile memory module 43. The data processing circuit is configured to process both the data to be written into the rewritable non-volatile memory module 43 and the data to be read from the rewritable non-volatile memory module 43. The write command sequence, the read command sequence, and the erase command sequence may respectively include one or more program codes or command codes and are configured to instruct the rewritable non-volatile memory module 43 to perform corresponding operations of writing, reading, and erasing. In an exemplary embodiment, the memory management circuit 51 may also give other types of command sequences to the rewritable non-volatile memory module 43 and instruct the same to perform corresponding operations.

The host interface 52 is coupled to the memory management circuit 51. The memory management circuit 51 may communicate with the host system 11 through the host interface 52. The host interface 52 may be configured to receive and identify the commands and data transmitted by the host system 11. For example, the commands and data transmitted by the host system 11 may be transmitted to the memory management circuit 51 through the host interface 52. Further, the memory management circuit 51 may transmit data to the host system 11 through the host interface 52. In this exemplary embodiment, the host interface 52 is compliant with the PCI Express standard. However, it must be understood that the disclosure is not limited thereto. The host interface 52 may also be compatible with SATA standard, PATA standard, IEEE 1394 standard, USB standard, SD standard, UHS-I standard, UHS-II standard, MS standard, MMC standard, eMMC standard, UFS standard, CF standard, IDE standard or other suitable data transfer standard.

The memory interface 53 is coupled to the memory management circuit 51 and configured to access the rewritable non-volatile memory module 43. For example, the memory management circuit 51 may access the rewritable non-volatile memory module 43 through the memory interface 53. That is, the data to be written into the rewritable non-volatile memory module 43 will be converted into a format acceptable to the rewritable non-volatile memory module 43 through the memory interface 53. To be specific, if the memory management circuit 51 tries to access the rewritable non-volatile memory module 43, the memory interface 53 will transmit corresponding command sequences. For example, these command sequences may include a write command sequence to instruct a writing of data, a read command sequence to instruct a reading of data, an erase command sequence to instruct an erasing of data, and corresponding command sequences to instruct various memory operations (such as changing voltage level or performing a garbage collection operation or the like). These command sequences are, for example, generated by the memory management circuit 51 and transmitted to the rewritable non-volatile memory module 43 through the memory interface 53. These command sequences may include one or more signals, or data on the bus. These signals or data may include script or code. For example, in the read command sequence, information such as the read identification code and memory address will be included.

The error detecting and correcting circuit 54 is coupled to the memory management circuit 51 and is configured to perform error detecting and correcting operations to ensure the correctness of the data. To be specific, when the memory management circuit 51 receives a write command from the host system 11, the error detecting and correcting circuit 54 generates corresponding error correcting code (ECC) and/or error detecting code (EDC) for the data corresponding to the write command, and the memory management circuit 51 writes the data corresponding to the write command and the corresponding error correcting code and/or error detecting code into the rewritable non-volatile memory module 43. Subsequently, when the memory management circuit 51 reads data from the rewritable non-volatile memory module 43, it simultaneously reads the error correcting code and/or error detecting code corresponding to the data, and the error detecting and correcting circuit 54 will perform error detecting and correcting operations on the read data according to the error correcting code and/or the error detecting code.

In an exemplary embodiment, the error detecting and correcting circuit 54 may support low-density parity check (LDPC) codes. For example, an error detecting and correcting circuit 508 may use low-density parity check codes for encoding and decoding. In an exemplary embodiment, the error detecting and correcting circuit 54 may also use other types of encoding/decoding algorithms, such as BCH or Reed-Solomon (RS) codes. The disclosure is not limited thereto.

In an exemplary embodiment, the memory control circuit unit 42 further includes a buffer memory 55 and a power management circuit 56. The buffer memory 55 is coupled to the memory management circuit 51 and configured to temporarily store data. The power management circuit 56 is coupled to the memory management circuit 51 and configured to control the power of the memory storage device 10.

In an exemplary embodiment, the rewritable non-volatile memory module 43 of FIG. 4 may include a flash memory module. In an example embodiment, the memory control circuit unit 42 of FIG. 4 may include a flash memory controller. In an example embodiment, the memory management circuit 51 of FIG. 5 may include a flash memory management circuit.

Figure 6:
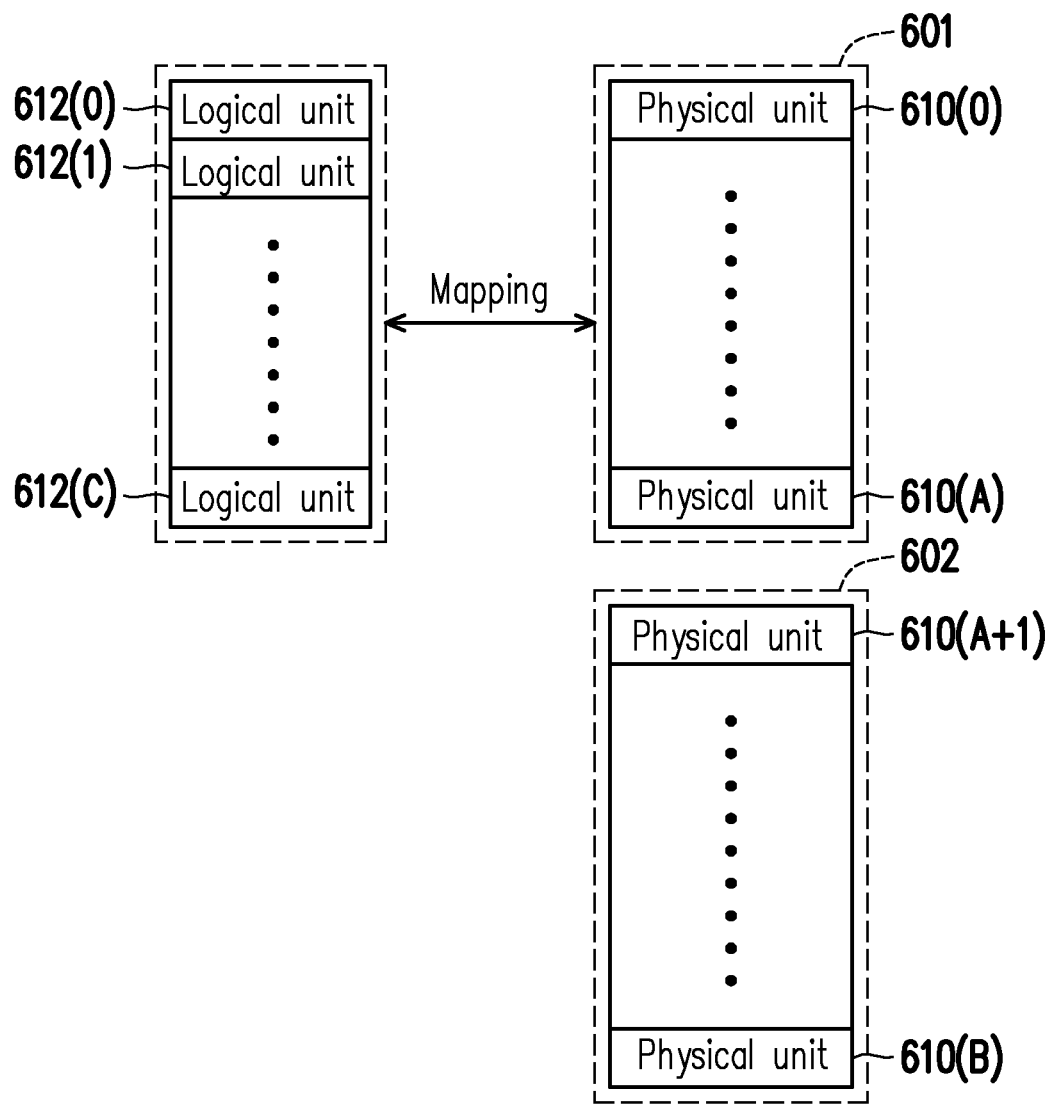
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure. Referring to FIG. 6, the memory management circuit 51 may logically group physical units 610(0) to 610(B) in the rewritable non-volatile memory module 43 into a storage area 601 and a spare area 602.

In an exemplary embodiment, a physical unit refers to a physical address or a physical programming unit. In an exemplary embodiment, a physical unit may also be composed of a plurality of consecutive or non-consecutive physical addresses. In an exemplary embodiment, a physical unit may also refer to a virtual block (VB). A virtual block may include a plurality of physical addresses or a plurality of physical programming units.

The physical units 610(0) to 610(A) in the storage area 601 are configured to store user data (e.g. user data from the host system 11 of FIG. 1). For example, the physical units 610(0) to 610(A) in the storage area 601 may store valid data and invalid data. The physical units 610(A+1) to 610(B) in the spare area 602 do not store data (e.g. valid data). For example, if a certain physical unit does not store valid data, this physical unit may be associated (or added) to the spare area 602. Moreover, the physical unit (or physical unit not storing valid data) in the spare area 602 may be erased. When new data is written, one or more physical units may be extracted from spare area 602 to store the new data. In an exemplary embodiment, the spare area 602 is also referred to as a free pool.

The memory management circuit 51 may configure logic units 612(0) to 612(C) to map the physical units 610(0) to 610(A) in the storage area 601. In an exemplary embodiment, each logic unit corresponds to a logical address. For example, a logical address may include one or more logical block addresses (LBA) or other logical management units. In an exemplary embodiment, a logic unit may also correspond to a logic programming unit or be composed of a plurality of consecutive or non-consecutive logical addresses.

Note that a logic unit may be mapped to one or more physical units. If a certain physical unit is currently mapped by a certain logic unit, it indicates that the data currently stored in this physical unit includes valid data. On the contrary, if a certain physical unit is not currently mapped by any logic unit, it indicates that the data currently stored in this physical unit is invalid data.

The memory management circuit 51 may record management data (also referred to as logical-to-physical mapping information) describing the mapping relationship between logic units and physical units in at least one logical-to-physical address mapping table. When the host system 11 tries to read data from the memory storage device 10 or write data into the memory storage device 10, the memory management circuit 51 may access the rewritable non-volatile memory module 43 according to the information in the logic-to-physical address mapping table.

In low-density parity check codes, a check matrix (also referred to as a parity check matrix) is configured to define an effective codeword. The parity check matrix is marked as a matrix M and a codeword is marked as V hereinafter. According to an equation (1) below, if a multiplication of the parity check matrix M and the codeword V results in a zero vector, it indicates that the codeword V is a valid codeword. Therein, an operator x represents a mod 2 matrix multiplication. In other words, a null space of the matrix M includes all the valid codewords. However, a content of the codeword V is not limited in the disclosure. For example, the codeword V may also include the error correcting code or the error detecting code generated by using any algorithm.

$$V \times M^T = 0 \quad (1)$$

The codeword V may include message bits and parity bits. Namely, the codeword V may be represented by [U P]. A vector U is constituted by the message bits. A vector P is constituted by the parity bits. The vector U is also referred to as write data (or data to be encoded). The vector P is also referred to as parity data.

In a codeword, parity bits (i.e. parity data) are configured to protect message bits (i.e. write data) and may be regarded as error correcting codes or error detecting codes generated corresponding to the message bits. In addition, protecting the message bits means, for example, maintaining the correctness of the message bits. For example, when a message bit is read from the rewritable non-volatile memory module 43, the parity bit corresponding to the message bit may be configured to correct possible errors in the message bit.

When decoding the codeword V, a parity check operation is first executed on the codeword V, such as multiplying the matrix M by the codeword V to generate a vector (hereinafter, marked as S, as shown in an equation (2) below). Each element in the vector S is also referred to as a syndrome. The vector S is also referred to as syndrome data. If the vector S is the zero vector (i.e. every element in the vector S is zero), the codeword V may be outputted directly. If the vector S is not the zero vector (i.e. at least one element in the vector S is not zero), it indicates the codeword V includes at least one error and the codeword V is not the valid codeword. If the codeword V is not the valid codeword, the error detecting and correcting circuit 54 may perform a decoding operation to attempt correcting errors in the codeword V.

$$V \times H^T = S \quad (2)$$

In an exemplary embodiment, the error detecting and correcting circuit 54 may include an encoding circuit 541 and a decoding circuit 542. The encoding circuit 541 is configured to encode data. The decoding circuit 542 is configured to decode data. In an exemplary embodiment, the encoding circuit 541 and the decoding circuit 542 may also be combined into a single encoding/decoding circuit.

The memory management circuit 51 may receive write data from the host system 11. The encoding circuit 541 may perform an encoding operation (also referred to as a first encoding operation) to generate parity data (also referred to as first parity data) according to the write data and a plurality of sub-matrices (also referred to as a first sub-matrix and a second sub-matrix) in the matrix M. After generating the first parity data, the encoding circuit 541 may perform another encoding operation (also referred to as a second encoding operation) to generate parity data (also referred to as second parity data) according to the write data, the first parity data, and a plurality of sub-matrices (also referred to as a third sub-matrix, a fourth sub-matrix, and a fifth sub-matrix) in the matrix M. The first parity data is different from the second parity data. Furthermore, the first parity data may be used alone or in conjunction with the second parity data to decode the write data.

After encoding the write data, the memory management circuit 51 may send a write command sequence (also referred to as a first write command sequence) to the rewritable non-volatile memory module 43. The first write command sequence may be configured to instruct the rewritable non-volatile memory module 43 to store the write data, the first parity data, and the second parity data in the rewritable non-volatile memory module 43. Subsequently, when reading the write data from the rewritable non-volatile memory module 43, the memory management circuit 51 may also read the first parity data (and the second parity data) from the rewritable non-volatile memory module 43. The decoding circuit 542 may decode the write data read from the rewritable non-volatile memory module 43 according to the first parity data (and the second parity data) to detect and correct error in the data.

Figures 7A, 7B:
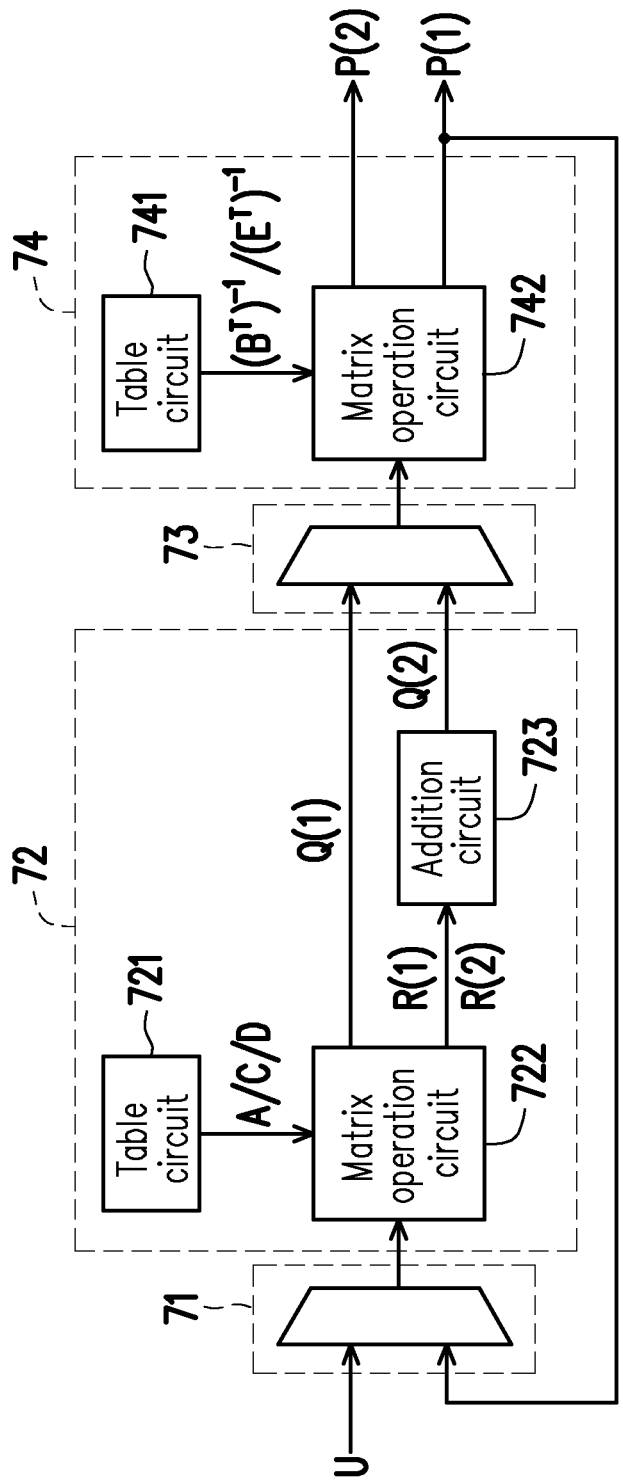
FIG. 7A is a schematic diagram of a parity check matrix according to an exemplary embodiment of the disclosure.
FIG. 7B is a schematic diagram of an encoding circuit according to an exemplary embodiment of the disclosure.

FIG. 7A is a schematic diagram of a parity check matrix according to an exemplary embodiment of the disclosure. Referring to FIG. 7A, in an exemplary embodiment, a structure of the matrix M (i.e. the parity check matrix) is shown as a matrix 701. The matrix 701 includes sub-matrices A to E and X. The sub-matrix X is a zero matrix, and the sub-matrices A to E are not zero matrices. The sub-matrix A may be an m×k matrix. The sub-matrix B may be an m×m matrix. The sub-matrix C may be an x×k matrix. The sub-matrix D may be an x×m matrix. The sub-matrix E may be an x×x matrix. The sub-matrix X may be an m×x matrix. k, m, and x are all positive integers, k may be larger than m, and m may be larger than x. The arrangement of the sub-matrices A to E and X in the matrix 701 is shown in FIG. 7A, but is not limited thereto.

In an exemplary embodiment, the first parity data may be generated according to an equation (3) below. In the Equation (3), U represents the write data to be encoded, A and B respectively represent the sub-matrices A and B in the matrix 701, and P(1) represents the first parity data. Further, the equation (3) may be further decomposed into equations (3.1) and (3.2) below. In the equations (3.1) and (3.2), Q(1) represents transient data (also referred to as first transient data) used in the process of generating the first parity data.

$$P(1)=(B^T)^{-1}\times(A^T\times U) \quad (3)$$

$$Q(1)=A^T\times U \quad (3.1)$$

$$P(1)=(B^T)^{-1}\times Q(1) \quad (3.2)$$

In an exemplary embodiment, the second parity data may be generated according to an equation (4) below. In the equation (4), C, D, and E respectively represent sub-matrices C, D, and E in the matrix 701, and P(2) represents the second parity data. Moreover, the equation (4) may be further decomposed into equations (4.1) to (4.5) below. In the equations (4.1) and (4.2), Q(2) represents transient data (also referred to as second transient data) used in the process of generating the second parity data. In the equations (4.3) to (4.5), R(1) and R(2) respectively represent sub-transient data (also referred to as first sub-transient data and second sub-transient data) used in the process of generating the second transient data.

$$P(2)=(E^T)^{-1}\times(C^T\times U+D^T\times P(1)) \quad (4)$$

$$Q(2)=C^T\times U+D^T\times P(1) \quad (4.1)$$

$$P(2)=(E^T)^{-1}\times Q(2) \quad (4.2)$$

$$R(1)=C^T\times U \quad (4.3)$$

$$R(2)=D^T\times P(1) \quad (4.4)$$

$$Q(2)=R(1)+R(2) \quad (4.5)$$

FIG. 7B is a schematic diagram of an encoding circuit according to an exemplary embodiment of the disclosure. Referring to FIG. 7A and FIG. 7B, the encoding circuit 541 may include a channel switching circuit (also referred to as a first channel switching circuit) 71, an encoding circuit (also referred to as a first encoding circuit) 72, a channel switching circuit (also referred to as a second channel switching circuit) 73, and an encoding circuit (also referred to as a second encoding circuit) 74. The encoding circuit 72 is coupled to the channel switching circuits 71 and 73. The encoding circuit 74 is coupled to the channel switching circuits 71 and 73.

The encoding circuit 541 may perform the first encoding operation to generate the parity data P(1). In the first encoding operation, the channel switching circuit 71 may provide write data U to the encoding circuit 72. The encoding circuit 72 may perform an operation corresponding to the equation (3.1) to generate the transient data Q(1) according to the write data U and the sub-matrix A. The channel switching circuit 73 may provide the transient data Q(1) to the encoding circuit 74. The encoding circuit 74 may perform an operation corresponding to the equation (3.2) to generate the parity data P(1) according to the transient data Q(1) and the sub-matrix B.

After performing the first encoding operation, the encoding circuit 541 may perform the second encoding operation to generate the parity data P(2). In the second encoding operation, the channel switching circuit 71 may provide the write data U to the encoding circuit 72 and feedback the parity data P(1) generated by the first encoding operation to the encoding circuit 72. The encoding circuit 72 may perform an operation corresponding to the equation (4.1) to generate the transient data Q(2) according to the write data U, the parity data P(1), the sub-matrix C, and the sub-matrix D. The channel switching circuit 73 may provide the transient data Q(2) to the encoding circuit 74. The encoding circuit 74 may perform an operation corresponding to the equation (4.2) to generate the parity data P(2) according to the transient data Q(2) and the sub-matrix E.

The channel switching circuits 71 and 73 may both include multiplexers. The encoding circuit 72 may include a table circuit 721, a matrix operation circuit (also referred to as a first matrix operation circuit) 722, and an addition circuit 723. The matrix operation circuit 722 is coupled to the channel switching circuit 71, the table circuit 721, and the addition circuit 723. The table circuit 721 stores information of the sub-matrices A, C, and D. The matrix operation circuit 722 may include at least one shifter, at least one exclusive OR (XOR) circuit, and at least one register to perform required operation functions. The addition circuit 723 may include at least one XOR circuit and at least one register to perform required operation functions.

The encoding circuit 74 may include a table circuit 741 and a matrix operation circuit (also referred to as a second matrix operation circuit) 742. The matrix operation circuit 742 is coupled to the channel switching circuit 73, the table circuit 741, and the channel switching circuit 71. The table circuit 741 stores information of the sub-matrices B and E. The matrix operation circuit 742 may include a circuit structure same or similar to that of the matrix operation circuit 722 to perform required operation functions.

In the first encoding operation, the matrix operation circuit 722 may obtain the information of the sub-matrix A from the table circuit 721 and receive the write data U through the channel switching circuit 71. The matrix operation circuit 722 may perform a matrix operation corresponding to the equation (3.1) to generate the transient data Q(1) according to the write data U and the sub-matrix A. The matrix operation circuit 742 may obtain the information of the sub-matrix B (e.g. the information of an inverse matrix of the sub-matrix B) from the table circuit 741 and receive the transient data Q(1) through the channel switching circuit 73. The matrix operation circuit 742 may perform a matrix operation corresponding to the equation (3.2) to generate the parity data P(1) according to the transient data Q(1) and the sub-matrix B (i.e. the inverse matrix of the sub-matrix B).

In the second encoding operation, the matrix operation circuit 722 may receive the information of the sub-matrices C and D from the table circuit 721 and receive the write data U and the parity data P(1) through the channel switching circuit 71. The matrix operation circuit 722 may perform an operation corresponding to the equation (4.3) to generate the sub-transient data R(1) according to the write data U and the sub-matrix C and perform an operation corresponding to the equation (4.4) to generate the sub-transient data R(2) according to the parity data P(1) and the sub-matrix D. The addition circuit 723 may perform an operation corresponding to the equation (4.5) to generate the transient data Q(2) according to the sub-transient data R(1) and R(2). The matrix operation circuit 742 may obtain the information of the sub-matrix E (e.g. the information of an inverse matrix of the sub-matrix E) from the table circuit 741 and receive the transient data Q(2) through the channel switching circuit 73. The matrix operation circuit 742 may perform a matrix operation corresponding to the equation (4.2) to generate the parity data P(2) according to the transient data Q(2) and the sub-matrix E (i.e. the inverse matrix of the sub-matrix E).

In other words, in the exemplary embodiment of FIGS. 7A and 7B, the parity data P(1) and P(2) may be sequentially generated by the same encoding circuit 541. In this way, the use efficiency of the encoding circuit 541 can be effectively improved.

In an example embodiment, the encoding circuit 541 may also perform another encoding operation (also referred to as a third encoding operation) to generate parity data (also referred to as third parity data) according to the write data, the first parity data, the second parity data, and a plurality of sub-matrices (also referred to as a sixth sub-matrix, a seventh sub-matrix, and an eighth sub-matrix) in the matrix M. The first parity data, the second parity data, and the third parity data are different from each other. Moreover, the first parity data may be used alone, in conjunction with the second parity data, or in conjunction with the second parity data and the third parity data to decode the write data.

After generating the third parity data, the memory management circuit 51 may also send a write command sequence (also referred to as a second write command sequence) to the rewritable non-volatile memory module 43. The second write command sequence may be configured to instruct the rewritable non-volatile memory module 43 to store the third parity data to the rewritable non-volatile memory module 43. Later, when reading the write data from the rewritable non-volatile memory module 43, the memory management circuit 51 may also read the third parity data from the rewritable non-volatile memory module 43 at the same time. The decoding circuit 542 may also decode the write data read from the rewritable non-volatile memory module 43 according to the first parity data, the second parity data, and the third parity data to detect and correct error in the write data.

Figures 8A, 8B:
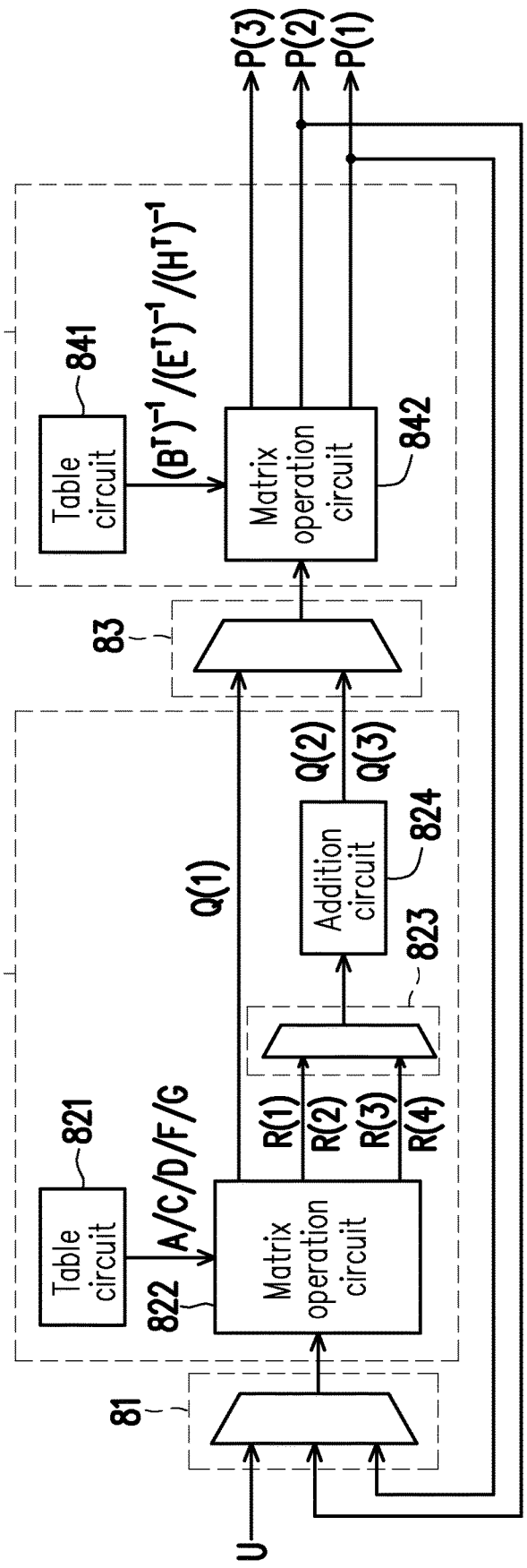
FIG. 8A is a schematic diagram of a parity check matrix according to an exemplary embodiment of the disclosure.
FIG. 8B is a schematic diagram of an encoding circuit according to an exemplary embodiment of the disclosure.

FIG. 8A is a schematic diagram of a parity check matrix according to an exemplary embodiment of the disclosure. Referring to FIG. 8A, in an exemplary embodiment, a structure of the matrix M (i.e. the parity check matrix) is shown as a matrix 801. The matrix 801 includes the matrix 701 of FIG. 7A, and sub-matrices F to H and Y. The sub-matrix Y is a zero matrix, and the sub-matrices F to H are not zero matrices. The sub-matrix F may be a y×k matrix. The sub-matrix G may be a y×(m+x) matrix. The sub-matrix H may be a y×y matrix. The sub-matrix Y may be an (m+x)×y matrix. K, m, x and y are all positive integers, k may be larger than m, and m may be larger than x and y. The arrangement of the matrix 701 and the sub-matrices F to H and Y in the matrix 801 is shown in FIG. 8A, but is not limited thereto. In other words, the matrix 801 may be obtained by expanding the matrix 701 (adding the sub-matrices F to H and Y).

In an exemplary embodiment, the third parity data may be generated according to an equation (5) below. In the equation (5), F, G, and H respectively represent the sub-matrices F, G, and H in the matrix 801, and P(3) represents the third parity data. Moreover, the equation (5) may be further decomposed into equations (5.1) to (5.5) below. In the equations (5.1) and (5.2), Q(3) represents transient data (also referred to as third transient data) used in the process of generating the third parity data. In the equations (5.3) to (5.5), R(3) and R(4) respectively represent sub-transient data (also referred to as third sub-transient data and fourth sub-transient data) used in the process of generating the third transient data.

$$P(3)=(H^T)^{-1}\times(F^T\times U+G^T\times\{P(1),P(2)\}) \quad (5)$$

$$Q(3)=F^T\times U+G^T\times\{P(1),P(2)\} \quad (5.1)$$

$$P(3)=(H^T)^{-1}\times Q(3) \quad (5.2)$$

$$R(3)=F^T\times U \quad (5.3)$$

$$R(4)=G^T\times\{P(1),P(2)\} \quad (5.4)$$

$$Q(3)=R(3)+R(4) \quad (5.5)$$

FIG. 8B is a schematic diagram of an encoding circuit according to an exemplary embodiment of the disclosure. Referring to FIGS. 8A and 8B, the encoding circuit 541 may include a channel switching circuit (i.e. a first channel switching circuit) 81, an encoding circuit (i.e. a first encoding circuit) 82, a channel switching circuit (i.e. a second channel switching circuit) 83, and an encoding circuit (i.e. a second encoding circuit) 84. The encoding circuit 82 is coupled to the channel switching circuits 81 and 83. The encoding circuit 84 is coupled to the channel switching circuits 81 and 83.

The encoding circuit 541 may perform the first encoding operation to generate the parity data P(1). In the first encoding operation, the channel switching circuit 81 may provide the write data U to the encoding circuit 82. The encoding circuit 82 may perform an operation corresponding to the equation (3.1) to generate the transient data Q(1) according to the write data U and the sub-matrix A. The channel switching circuit 83 may provide the transient data Q(1) to the encoding circuit 84. The encoding circuit 84 may perform an operation corresponding to the equation (3.2) to generate the parity data P(1) according to the transient data Q(1) and the sub-matrix B.

After performing the first encoding operation, the encoding circuit 541 may perform the second encoding operation to generate the parity data P(2). In the second encoding operation, the channel switching circuit 81 may provide the write data U to the encoding circuit 82 and feedback the parity data P(1) generated by the first encoding operation to the encoding circuit 82. The encoding circuit 82 may perform an operation corresponding to the equation (4.1) to generate the transient data Q(2) according to the write data U, the parity data P(1), the sub-matrix C, and the sub-matrix D. The channel switching circuit 83 may provide the transient data Q(2) to the encoding circuit 84. The encoding circuit 84 may perform an operation corresponding to the equation (4.2) to generate the parity data P(2) according to the transient data Q(2) and the sub-matrix E.

After performing the second encoding operation, the encoding circuit 541 may perform the third encoding operation to generate the parity data P(3). In the third encoding operation, the channel switching circuit 81 may provide the write data U to the encoding circuit 82, feedback the parity data P(1) generated by the first encoding operation to the encoding circuit 82, and feedback the parity data P(2) generated by the second encoding operation to the encoding circuit 82. The encoding circuit 82 may perform an operation corresponding to the equation (5.1) to generate the transient data Q(3) according to the write data U, the parity data P(1), the parity data P(2), the sub-matrix F, and the sub-matrix G. The channel switching circuit 83 may provide the transient data Q(3) to the encoding circuit 84. The encoding circuit 84 may perform an operation corresponding to the equation (5.2) to generate the parity data P(3) according to the transient data Q(3) and the sub-matrix H.

The channel switching circuits 81 and 83 may both include multiplexers. Note that the encoding circuit 82 may include a table circuit 821, a matrix operation circuit (i.e. a first matrix operation circuit) 822, a channel switching circuit (also referred to as a third channel switching circuit) 823, and an addition circuit 824. The channel switching circuit 823 is coupled between the matrix operation circuit 822 and the addition circuit 824. The channel switching circuit 823 may include a multiplexer. The table circuit 821 stores the information of the sub-matrices A, C, D, F, and G. The matrix operation circuit 822 may include at least one shifter, at least one XOR circuit, and at least one register to perform required operation functions. The addition circuit 824 may include at least one XOR circuit and at least one register to perform required operation functions.

The encoding circuit 84 may include a table circuit 841 and a matrix operation circuit (i.e. a second matrix operation circuit) 842. The table circuit 841 stores the information of the sub-matrices B, E, and H. The matrix operation circuit 842 may include a structure same or similar to that of the matrix operation circuit 822 to perform required operation functions.

In the first encoding operation, the matrix operation circuit 822 may obtain the information of the sub-matrix A from the table circuit 821 and receive the write data U through the channel switching circuit 81. The matrix operation circuit 822 may perform a matrix operation corresponding to the equation (3.1) to generate the transient data Q(1) according to the write data U and the sub-matrix A. The matrix operation circuit 842 may obtain the information of the sub-matrix B (e.g. the information of the inverse matrix of the sub-matrix B) from the table circuit 841 and receive the transient data Q(1) through the channel switching circuit 83. The matrix operation circuit 842 may perform a matrix operation corresponding to the equation (3.2) to generate the parity data P(1) according to the transient data Q(1) and the sub-matrix B (i.e. the inverse matrix of the sub-matrix B).

In the second encoding operation, the matrix operation circuit 822 may receive the information of the sub-matrices C and D from the table circuit 821 and receive the write data U and the parity data P(1) through the channel switching circuit 81. The matrix operation circuit 822 may perform an operation corresponding to the equation (4.3) to generate the sub-transient data R(1) according to the write data U and the sub-matrix C and perform an operation corresponding to the equation (4.4) to generate the sub-transient data R(2) according to the parity data P(1) and the sub-matrix D. The channel switching circuit 823 may provide the sub-transient data R(1) and R(2) to the addition circuit 824. The addition circuit 824 may perform an operation corresponding to the equation (4.5) to generate the transient data Q(2) according to the sub-transient data R(1) and R(2). The matrix operation circuit 842 may obtain the information of the sub-matrix E (e.g. the information of the inverse matrix of the sub-matrix E) from the table circuit 841 and receive the transient data Q(2) through the channel switching circuit 83. The matrix operation circuit 842 may perform a matrix operation corresponding to the equation (4.2) to generate the parity data P(2) according to the transient data Q(2) and the sub-matrix E (i.e. the inverse matrix of the sub-matrix E).

In the third encoding operation, the matrix operation circuit 822 may receive the information of the sub-matrices F and G from the table circuit 821 and receive the write data U, the parity data P(1), and the parity data P(2) through the channel switching circuit 81. The matrix operation circuit 822 may perform an operation corresponding to the equation (5.3) to generate the sub-transient data R(3) according to the write data U and the sub-matrix F and perform an operation corresponding to the equation (5.4) to generate the sub-transient data R(4) according to the parity data P(1), the parity data P(2), and the sub-matrix G. The channel switching circuit 823 may provide the sub-transient data R(3) and R(4) to the addition circuit 824. The addition circuit 824 may perform an operation corresponding to the equation (5.5) to generate the transient data Q(3) according to the sub-transient data R(3) and R(4). The matrix operation circuit 842 may obtain the information of the sub-matrix H (e.g. the information of an inverse matrix of the sub-matrix H) from the table circuit 841 and receive the transient data Q(3) through the channel switching circuit 83. The matrix operation circuit 842 may perform a matrix operation corresponding to the equation (5.2) to generate the parity data P(3) according to the transient data Q(3) and the sub-matrix H (i.e. the inverse matrix of the sub-matrix H).

In other words, in the exemplary embodiments of FIGS. 8A and 8B, the parity data P(1), P(2) and P(3) may be sequentially generated by the same encoding circuit 541. In this way, the use efficiency of the encoding circuit 541 can be further improved.

Figure 9:
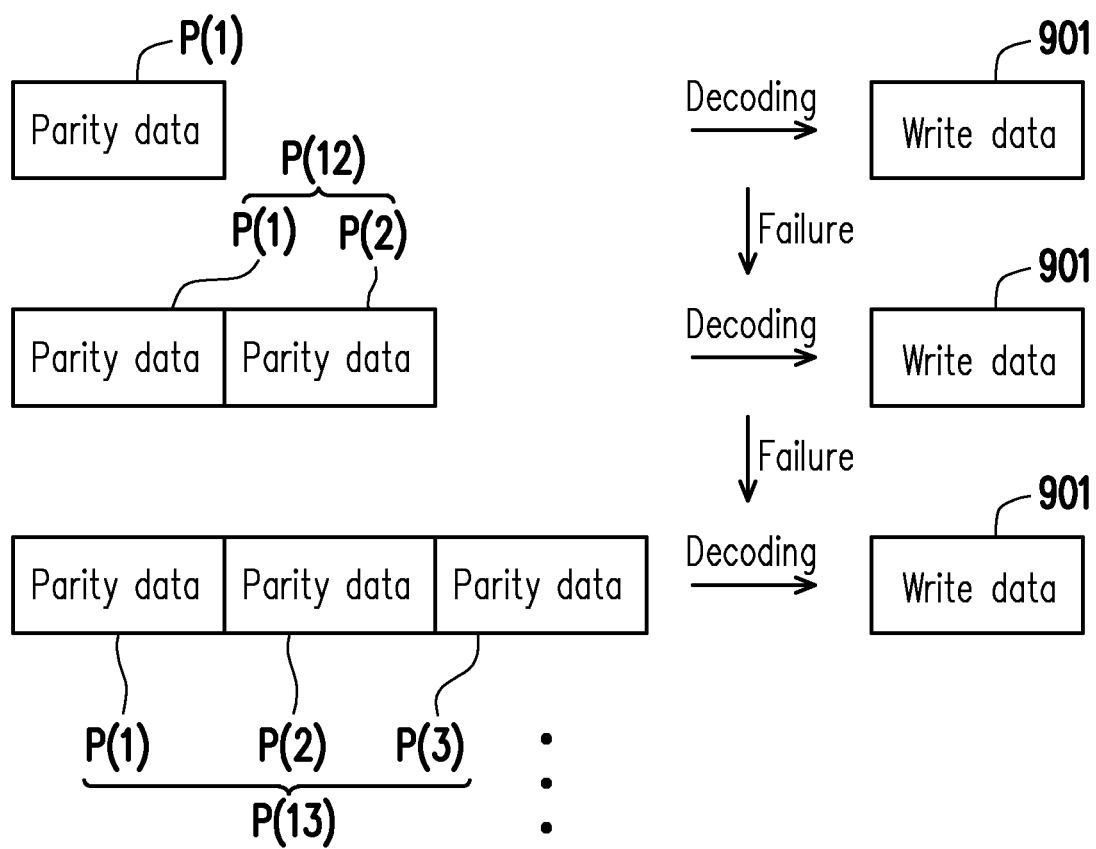
FIG. 9 is a schematic diagram of a decoding process according to an exemplary embodiment of the disclosure.

FIG. 9 is a schematic diagram of a decoding process according to an exemplary embodiment of the disclosure. Referring to FIG. 9, it is assumed that the parity data P(1) to P(3) are all generated by encoding write data 901 stored in the rewritable non-volatile memory module 43. The relevant operation details have been described in detail above, and will not be repeated herein.

After the write data 901 is read from the rewritable non-volatile memory module 43, the parity data P(1) may be read out from the rewritable non-volatile memory module 43 at the same time. The decoding circuit 542 may decode the write data 901 using the parity data P(1). If the write data 901 may be successfully decoded according to the parity data P(1) (e.g. errors in the write data 901 read out are all corrected), the decoding of the write data 901 may be ended.

However, if the write data 901 cannot be successfully decoded according to the parity data P(1) (e.g. not all errors in the write data 901 read out are corrected), the memory management circuit 51 may instruct the rewritable non-volatile memory module 43 to read the parity data P(2). The decoding circuit 542 may decode the write data 901 using the parity data P(1) and P(2). For example, parity data P(1) and P(2) may be combined into parity data P(12) with a longer data length to decode the write data 901. In particular, the data length of the parity data P(12) is longer than that of the parity data P(1), so the error correcting capability of the parity data P(12) may be higher than that of the parity data P(1). Therefore, the decoding success rate of decoding the write data 901 using the parity data P(12) may be higher than the decoding success of decoding the write data 901 using the parity data P(1).

However, if the write data 901 cannot be successfully decoded according to the parity data P(12), the memory management circuit 51 may further instruct the rewritable non-volatile memory module 43 to read the parity data P(3). The decoding circuit 542 may decode the write data 901 using the parity data P(1), P(2), and P(3). For example, the parity data P(1), P(2), and P(3) may be combined into parity data P(13) with a longer data length to decode the write data 901. In particular, the data length of the parity data P(13) is longer than that of the parity data P(12), so the error correcting capability of the parity data P(13) may be higher than that of the parity data P(12). Therefore, the decoding success rate of decoding the write data 901 using the parity data P(13) may be higher than the decoding success of decoding the write data 901 using the parity data P(12). In an exemplary embodiment, the decoding circuit 542 can gradually improve the error correcting capability of the write data 901 by gradually increasing the data length of the parity data during the decoding process.

In the exemplary embodiment of FIG. 9, the parity data P(1), P(12), and P(13) may be independently configured to decode the write data 901. However, the parity data P(2) and P(3) cannot be configured to decode the write data 901 alone.

In an exemplary embodiment, by expanding the matrix 801 (e.g. adding more sub-matrices in the matrix 801), the encoding circuit 541 may also encode the same write data to generate more parity data P(4) to P(n) according to the expanded matrix 801. In subsequent decoding of the write data, in response to decoding failure, the parity data P(4) to P(n) may be sequentially configured to extend the data length of the initial parity data P(1). Thereby, the decoding success rate of the write data can be effectively improved.

Figure 10:
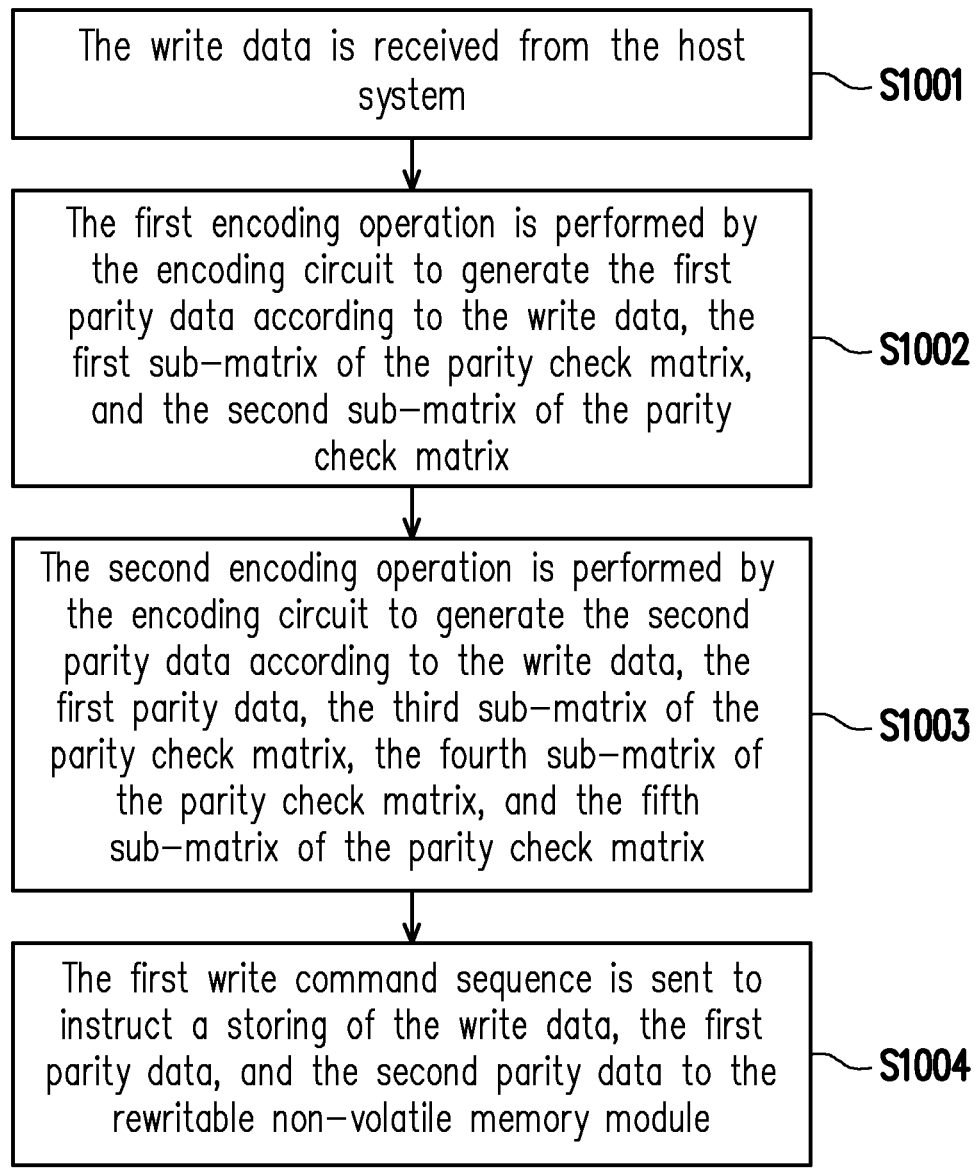
FIG. 10 is a flowchart of an encoding control method according to an exemplary embodiment of the disclosure.

FIG. 10 is a flowchart of an encoding control method according to an exemplary embodiment of the disclosure. Referring to FIG. 10, in step S1001, the write data is received from the host system. In step S1002, the first encoding operation is performed by the encoding circuit to generate the first parity data according to the write data, the first sub-matrix of the parity check matrix, and the second sub-matrix of the parity check matrix. In step S1003, the second encoding operation is performed by the encoding circuit to generate the second parity data according to the write data, the first parity data, the third sub-matrix of the parity check matrix, the fourth sub-matrix of the parity check matrix, and the fifth sub-matrix of the parity check matrix. The first parity data is used alone or in conjunction with the second parity data to decode the write data. In step S1004, a first write command sequence is sent to instruct a storing of the write data, the first parity data, and the second parity data to the rewritable non-volatile memory module.

Each step in FIG. 10 has been described in detail as above, and will not be repeated herein. Note that each step in FIG. 10 may be implemented as a plurality of codes or circuits, which is not limited by the disclosure. In addition, the method of FIG. 10 may be used in conjunction with the above exemplary embodiments, and may also be used alone, and the disclosure is not limited thereto.

In summary, the exemplary embodiments of the disclosure provide encoding the same write data to generate a plurality of parity data according to different sub-matrices in the same parity check matrix by using the same encoding circuit. Later, these parity data may be used alone or in conjunction as required to decode the write data. In this way, the decoding efficiency of the write data and the use flexibility of the encoding circuit can be effectively improved.

The previously described exemplary embodiments of the disclosure have the advantages aforementioned, wherein the advantages aforementioned not required in all versions of the disclosure.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An encoding control method for a rewritable non-volatile memory module, the encoding control method comprising:
   receiving write data from a host system;
   performing, by an encoding circuit, a first encoding operation to generate first parity data according to the write data, a first sub-matrix of a parity check matrix, and a second sub-matrix of the parity check matrix;
   performing, by the encoding circuit, a second encoding operation to generate second parity data according to the write data, the first parity data, a third sub-matrix of the parity check matrix, a fourth sub-matrix of the parity check matrix, and a fifth sub-matrix of the parity check matrix; and
   sending a first write command sequence to instruct a storing of the write data, the first parity data, and the second parity data to a rewritable non-volatile memory module.

2. The encoding control method according to claim 1, wherein the first encoding operation comprises:
   providing, by a first channel switching circuit of the encoding circuit, the write data to a first encoding circuit of the encoding circuit;
   generating, by the first encoding circuit, first transient data according to the write data and the first sub-matrix;
   providing, by a second channel switching circuit of the encoding circuit, the first transient data to a second encoding circuit of the encoding circuit; and
   generating, by the second encoding circuit, the first parity data according to the first transient data and the second sub-matrix.

3. The encoding control method according to claim 1, wherein the second encoding operation comprises:
   providing, by a first channel switching circuit of the encoding circuit, the write data to a first encoding circuit of the encoding circuit;
   feeding back, by the first channel switching circuit, the first parity data to the first encoding circuit;
   generating, by the first encoding circuit, second transient data according to the write data, the first parity data, the third sub-matrix, and the fourth sub-matrix;
   providing, by a second channel switching circuit of the encoding circuit, the second transient data to a second encoding circuit of the encoding circuit; and
   generating, by the second encoding circuit, the second parity data according to the second transient data and the fifth sub-matrix.

4. The encoding control method according to claim 3, wherein generating, by the first encoding circuit, the second transient data according to the write data, the first parity data, the third sub-matrix, and the fourth sub-matrix comprises:

generating, by a first matrix operation circuit of the first encoding circuit, first sub-transient data according to the write data and the third sub-matrix;

generating, by the first matrix operation circuit, second sub-transient data according to the first parity data and the fourth sub-matrix; and generating, by an addition circuit of the first encoding circuit, the second transient data according to the first sub-transient data and the second sub-transient data.

5. The encoding control method according to claim 1, further comprising:

performing, by the encoding circuit, a third encoding operation to generate third parity data according to the write data, the first parity data, the second parity data, a sixth sub-matrix of the parity check matrix, a seventh sub-matrix of the parity check matrix, and an eight sub-matrix of the parity check matrix; and sending a second write command sequence to instruct a storing of the third parity data to the rewritable non-volatile memory module.

6. The encoding control method according to claim 5, wherein the third encoding operation comprises:

proving, by a first channel switching circuit of the encoding circuit, the write data to a first encoding circuit of the encoding circuit;

feeding back, by the first channel switching circuit, the first parity data and the second parity data to the first encoding circuit;

generating, by the first encoding circuit, third transient data according to the write data, the first parity data, the second parity data, the sixth sub-matrix, and the seventh sub-matrix;

providing, by a second channel switching circuit of the encoding circuit, the third transient data to a second encoding circuit of the encoding circuit; and generating, by the second encoding circuit, the third parity data according to the third transient data and the eighth sub-matrix.

7. The encoding control method according to claim 6, wherein generating, by the first encoding circuit of the encoding circuit, the third transient data according to the write data, the first parity data, the second parity data, the sixth sub-matrix, and the seventh sub-matrix comprises:

generating, by a first matrix operation circuit of the first encoding circuit, third sub-transient data according to the write data and the sixth sub-matrix;

generating, by the first matrix operation circuit, fourth sub-transient data according to the first parity data, the second parity data, and the seventh sub-matrix; and generating, by an addition circuit of the first encoding circuit, the third transient data according to the third sub-transient data and the fourth sub-transient data.

8. The encoding control method according to claim 7, wherein generating, by the first encoding circuit of the encoding circuit, the third transient data according to the write data, the first parity data, the second parity data, the sixth sub-matrix and the seventh sub-matrix further comprises:

providing, by a third channel switching circuit of the first encoding circuit, the third sub-transient data and the fourth sub-transient data to the addition circuit.

9. A memory storage device, comprising:

a connection interface unit configured for coupling to a host system;

a rewritable non-volatile memory module; and a memory control circuit unit, coupled to the connection interface unit and the rewritable non-volatile memory module, wherein the memory control circuit unit is configured to:
receive write data from the host system; and
send a first write command sequence to instruct a storing of the write data, first parity data, and second parity data to the rewritable non-volatile memory module, and the memory control circuit unit comprises an encoding circuit, and the encoding circuit is configured to:
perform a first encoding operation to generate the first parity data according to the write data, a first sub-matrix of a parity check matrix, and a second sub-matrix of the parity check matrix; and
perform a second encoding operation to generate the second parity data according to the write data, the first parity data, a third sub-matrix of the parity check matrix, a fourth sub-matrix of the parity check matrix, and a fifth sub-matrix of the parity check matrix.

10. The memory storage device according to claim 9, wherein the encoding circuit comprises:

a first channel switching circuit;
a first encoding circuit, coupled to the first channel switching circuit;
a second channel switching circuit, coupled to the first encoding circuit; and
a second encoding circuit, coupled to the second channel switching circuit and the first channel switching circuit, wherein in the first encoding operation, the first channel switching circuit is configured to provide the write data to the first encoding circuit, the first encoding circuit is configured to generate first transient data according to the write data and the first sub-matrix, the second channel switching circuit is configured to provide the first transient data to the second encoding circuit, and the second encoding circuit is configured to generate the first parity data according to the first transient data and the second sub-matrix.

11. The memory storage device according to claim 9, wherein the encoding circuit comprises:

a first channel switching circuit;
a first encoding circuit, coupled to the first channel switching circuit;
a second channel switching circuit, coupled to the first encoding circuit; and
a second encoding circuit, coupled to the second channel switching circuit and the first channel switching circuit, wherein in the second encoding operation, the first channel switching circuit is configured to provide the write data to the first encoding circuit, the first channel switching circuit is further configured to feedback the first parity data to the first encoding circuit, the first encoding circuit is configured to generate second transient data according to the write data, the first parity data, the third sub-matrix, and the fourth sub-matrix, the second channel switching circuit is configured to provide the second transient data to the second encoding circuit, and the second encoding circuit is configured to generate the second parity data according to the second transient data and the fifth sub-matrix.

12. The memory storage device according to claim 11, wherein the first encoding circuit comprises:
   a first matrix operation circuit, coupled to the first channel switching circuit; and
   an addition circuit, coupled to the first matrix operation circuit and the second channel switching circuit,
   wherein in the second encoding operation, the first matrix operation circuit is configured to generate first sub-transient data according to the write data and the third sub-matrix, and generate second sub-transient data according to the first parity data and the fourth sub-matrix, and
   the addition circuit is configured to generate the second transient data according to the first sub-transient data and the second sub-transient data.

13. The memory storage device according to claim 9, wherein the encoding circuit is further configured to perform a third encoding operation to generate third parity data according to the write data, the first parity data, the second parity data, a sixth sub-matrix of the parity check matrix, a seventh sub-matrix of the parity check matrix, and an eighth sub-matrix of the parity check matrix, and
   the memory control circuit unit is further configured to send a second write command sequence to instruct a storing of the third parity data to the rewritable non-volatile memory module.

14. The memory storage device according to claim 13, wherein the encoding circuit comprises:
   a first channel switching circuit;
   a first encoding circuit, coupled to the first channel switching circuit;
   a second channel switching circuit, coupled to the first encoding circuit; and
   a second encoding circuit, coupled to the second channel switching circuit and the first channel switching circuit,
   wherein in the third encoding operation, the first channel switching circuit is configured to provide the write data to the first encoding circuit,
   the first channel switching circuit is further configured to feedback the first parity data and the second parity data to the first encoding circuit,
   the first encoding circuit is configured to generate third transient data according to the write data, the first parity data, the second parity data, the sixth sub-matrix, and the seventh sub-matrix,
   the second channel switching circuit is configured to provide the third transient data to the second encoding circuit, and
   the second encoding circuit is configured to generate the third parity data according to the third transient data and the eighth sub-matrix.

15. The memory storage device according to claim 14, wherein the first encoding circuit comprises:
   a first matrix operation circuit, coupled to the first channel switching circuit; and
   an addition circuit, coupled to the first matrix operation circuit and the second channel switching circuit,
   wherein in the third encoding operation, the first matrix operation circuit is configured to generate third sub-transient data according to the write data and the sixth sub-matrix and generate fourth sub-transient data according to the first parity data, the second parity data, and the seventh sub-matrix, and
   the addition circuit is configured to generate the third transient data according to the third sub-transient data and the fourth sub-transient data.

16. The memory storage device according to claim 15, wherein the first encoding circuit further comprises:
   a third channel switching circuit, coupled between the first matrix operation circuit and the addition circuit,
   wherein in the third encoding operation, the third channel switching circuit is configured to provide the third sub-transient data and the fourth sub-transient data to the addition circuit.

17. A memory control circuit unit for controlling a rewritable non-volatile memory module, the memory control circuit unit comprising:
   a host interface configured for coupling to the host system;
   a memory interface configured for coupling to the rewritable non-volatile memory module;
   an encoding circuit; and
   a memory management circuit, coupled to the host interface, the memory interface, and the encoding circuit,
   wherein the memory management circuit is configured to:
      receive write data from the host system; and
      send a first write command sequence to instruct a storing of the write data, first parity data, and second parity data to the rewritable non-volatile memory module, and
   the encoding circuit is configured to:
      perform a first encoding operation to generate the first parity data according to the write data, a first sub-matrix of a parity check matrix, and a second sub-matrix of the parity check matrix; and
      perform a second encoding operation to generate the second parity data according to the write data, the first parity data, a third sub-matrix of the parity check matrix, a fourth sub-matrix of the parity check matrix, and a fifth sub-matrix of the parity check matrix.

18. The memory control circuit unit according to claim 17, wherein the encoding circuit comprises:
   a first channel switching circuit;
   a first encoding circuit, coupled to the first channel switching circuit;
   a second channel switching circuit, coupled to the first encoding circuit; and
   a second encoding circuit, coupled to the second channel switching circuit and the first channel switching circuit,
   wherein in the first encoding operation, the first channel switching circuit is configured to provide the write data to the first encoding circuit,
   the first encoding circuit is configured to generate first transient data according to the write data and the first sub-matrix,
   the second channel switching circuit is configured to provide the first transient data to the second encoding circuit, and
   the second encoding circuit is configured to generate the first parity data according to the first transient data and the second sub-matrix.

19. The memory control circuit unit according to claim 17, wherein the encoding circuit comprises:
   a first channel switching circuit;
   a first encoding circuit, coupled to the first channel switching circuit;
   a second channel switching circuit, coupled to the first encoding circuit; and
   a second encoding circuit, coupled to the second channel switching circuit and the first channel switching circuit, wherein in the second encoding operation, the first channel switching circuit is configured to provide the write data to the first encoding circuit, the first channel switching circuit is further configured to feedback the first parity data to the first encoding circuit, the first encoding circuit is configured to generate second transient data according to the write data, the first parity data, the third sub-matrix, and the fourth sub-matrix, the second channel switching circuit is configured to provide the second transient data to the second encoding circuit, and the second encoding circuit is configured to generate the second parity data according to the second transient data and the fifth sub-matrix.

20. The memory control circuit unit according to claim 19, wherein the first encoding circuit comprises:

a first matrix operation circuit, coupled to the first channel switching circuit; and an addition circuit, coupled to the first matrix operation circuit and the second channel switching circuit, wherein in the second encoding operation, the first matrix operation circuit is configured to generate first sub-transient data according to the write data and the third sub-matrix and generate second sub-transient data according to the first parity data and the fourth sub-matrix, and the addition circuit is configured to generate the second transient data according to the first sub-transient data and the second sub-transient data.

21. The memory control circuit unit according to claim 17, wherein the encoding circuit is further configured to performs a third encoding operation to generate third parity data according to the write data, the first parity data, the second parity data, a sixth sub-matrix of the parity check matrix, a seventh sub-matrix of the parity check matrix, and an eighth sub-matrix of the parity check matrix, and the memory management circuit is further configured to send a second write command sequence to instruct a storing of the third parity data to the rewritable non-volatile memory module.

22. The memory control circuit unit according to claim 21, wherein the encoding circuit comprises:

a first channel switching circuit;

a first encoding circuit, coupled to the first channel switching circuit;

a second channel switching circuit, coupled to the first encoding circuit; and a second encoding circuit, coupled to the second channel switching circuit and the first channel switching circuit, wherein in the third encoding operation, the first channel switching circuit is configured to provide the write data to the first encoding circuit, the first channel switching circuit is further configured to feedback the first parity data and the second parity data to the first encoding circuit, the first encoding circuit is configured to generate third transient data according to the write data, the first parity data, the second parity data, the sixth sub-matrix, and the seventh sub-matrix, the second channel switching circuit is configured to provide the third transient data to the second encoding circuit, and the second encoding circuit is configured to generate the third parity data according to the third transient data and the eighth sub-matrix.

23. The memory control circuit unit according to claim 22, wherein the first encoding circuit comprises:

a first matrix operation circuit, coupled to the first channel switching circuit; and an addition circuit, coupled to the first matrix operation circuit and the second channel switching circuit, wherein in the third encoding operation, the first matrix operation circuit is configured to generate third sub-transient data according to the write data and the sixth sub-matrix and generate fourth-sub-transient data according to the first parity data, the second parity data, and the seventh sub-matrix, and the addition circuit is configured to generate the third transient data according to the third sub-transient data and the fourth sub-transient data.

24. The memory control circuit unit according to claim 23, wherein the first encoding circuit further comprises:

a third channel switching circuit, coupled between the first matrix operation circuit and the addition circuit, wherein in the third encoding operation, the third channel switching circuit is configured to provide the third sub-transient data and the fourth sub-transient data to the addition circuit.

* * * * *